(12) United States Patent
Chakravarty et al.

(10) Patent No.: US 8,418,008 B2
(45) Date of Patent: Apr. 9, 2013

(54) TEST TECHNIQUE TO APPLY A VARIABLE SCAN CLOCK INCLUDING A SCAN CLOCK MODIFIER ON AN INTEGRATED CIRCUIT

(75) Inventors: Sreejit Chakravarty, Mountain View, CA (US); Narendra B. Devta-Prasa, Milpitas, CA (US); Arun Gunda, San Jose, CA (US); Fan Yang, Redwood City, CA (US)

(73) Assignee: LSI Corporation, Milpitas, CA (US)

( * ) Notice: Subject to any disclaimer, the term of this patent is extended or adjusted under 35 U.S.C. 154(b) by 292 days.

(21) Appl. No.: 12/337,629

(22) Filed: Dec. 18, 2008

(65) Prior Publication Data

US 2010/0162060 A1    Jun. 24, 2010

(51) Int. Cl.
*G01R 31/28* (2006.01)
*G06F 11/00* (2006.01)

(52) U.S. Cl. ......... 714/731; 714/726; 714/733; 714/744

(58) Field of Classification Search ................... 714/724, 714/726, 727, 731, 733
See application file for complete search history.

(56) References Cited

U.S. PATENT DOCUMENTS

| | | | | |
|---|---|---|---|---|
| 5,281,864 A | * | 1/1994 | Hahn et al. | 327/202 |
| 5,592,493 A | * | 1/1997 | Crouch et al. | 714/729 |
| 6,000,051 A | * | 12/1999 | Nadeau-Dostie et al. | 714/727 |
| 6,442,722 B1 | * | 8/2002 | Nadeau-Dostie et al. | 714/731 |
| 7,038,494 B2 | * | 5/2006 | Morton | 326/93 |
| 7,467,340 B2 | * | 12/2008 | Whetsel | 714/724 |
| 7,500,165 B2 | * | 3/2009 | Guettaf | 714/731 |
| 7,761,755 B1 | * | 7/2010 | Payakapan et al. | 714/724 |
| 2002/0138801 A1 | * | 9/2002 | Wang et al. | 714/729 |
| 2003/0074621 A1 | * | 4/2003 | Dorsey | 714/733 |
| 2003/0084413 A1 | * | 5/2003 | Varney | 716/4 |
| 2003/0093734 A1 | * | 5/2003 | Zhang et al. | 714/731 |
| 2004/0064769 A1 | * | 4/2004 | Gupte et al. | 714/724 |
| 2006/0069973 A1 | * | 3/2006 | Athavale et al. | 714/726 |
| 2006/0107145 A1 | * | 5/2006 | Athavale et al. | 714/727 |
| 2006/0195746 A1 | * | 8/2006 | Cooke et al. | 714/741 |
| 2008/0282110 A1 | * | 11/2008 | Guettaf | 714/30 |
| 2010/0146349 A1 | * | 6/2010 | Asou | 714/731 |

OTHER PUBLICATIONS

Detection of Internal Stuck-open Faults in Scan Chains; F. Yang, et al.; IEEE 2008; 10 Pages.

* cited by examiner

*Primary Examiner* — Ajay Bhatia
*Assistant Examiner* — Daniel McMahon

(57) ABSTRACT

A scan clock modifier, a method of providing a variable scan clock, an IC including a scan clock modifier and a library including a cell of a scan clock modifier. In one embodiment, the scan clock modifier includes: (1) logic circuitry configured to provide at least one selected clock signal based on a test scan clock signal and a first clock control signal, both of the test scan clock signal and the first clock control signal received from test equipment and (2) comparison logic configured to provide a scan clock signal based on the at least one selected clock signal and at least one other clock control signal received from the test equipment, wherein the first and the at least one other clock control signals are different clock control signals.

22 Claims, 4 Drawing Sheets

TEST TECHNIQUE TO APPLY A VARIABLE SCAN CLOCK INCLUDING A SCAN CLOCK MODIFIER ON AN INTEGRATED CIRCUIT

TECHNICAL FIELD

This application is directed, in general, to Design for Test (DFT) and, more specifically, to providing a scan clock to drive a scan chain of an integrated circuit.

BACKGROUND

ICs should be tested following manufacture to ensure their proper operation. DFT is a design technique that adds testability features to the design of integrated circuits (ICs) to improve the application of manufacturing tests. For this reason, ICs are typically provided with a test access port (TAP) that conforms to Institute of Electrical and Electronics Engineers, Inc., (IEEE) 1149.1, or Joint Test Access Group (JTAG), standard. JTAG specifies a "boundary scanning" technique in which a tester (also called automated test equipment, or ATE) connected to the TAP via a JTAG (serial) bus provides a clock signal and one or more patterns of zeroes and ones (a "test pattern") to the IC and receives a resulting ("output") pattern of responses by the IC to the test pattern. An output pattern that does not match expectations indicates a failed test. The output pattern may be analyzed to determine the nature of the IC failure and perhaps where in the IC the failure occurred.

Scan chains are used to test an IC. A scan chain is a connection of flip-flops in an IC that can be configured as a shift register. Scan chains are connected to the ATE via the TAP interface. A scan clock signal driven by the ATE shifts the test data into the scan chains. For any given test block applied by the ATE, the frequency of the scan clock is defined and typically fixed for the duration of the test block. This is the speed at which the test data is shifted into the scan chain. The ATE also drives the TAP and other test control signals for scan testing using the scan chains. A controller of the TAP, a TAP controller, can generate additional test mode signals.

The type of ATE that is used for testing can vary. Though high end testers may have more features, the use of these testers may prove cost prohibitive. Additionally, standard programming tools for ATE may limit the type of variation a tester may desire.

SUMMARY

One aspect provides a scan clock modifier. In one embodiment, the scan clock modifier includes: (1) logic circuitry configured to provide at least one selected clock signal based on a test scan clock signal and a first clock control signal, both of the test scan clock signal and the first clock control signal received from test equipment and (2) comparison logic configured to provide a scan clock signal based on the at least one selected clock signal and at least one other clock control signal received from the test equipment, wherein the first and the at least one other clock control signals are different clock control signals.

In another aspect, a method of providing a variable scan clock for a test block is disclosed. In one embodiment, the method includes: (1) receiving a test scan clock signal from test equipment at a scan clock modifier of an integrated circuit, the test scan clock signal having a fixed frequency for a test block, (2) receiving clock control signals from the test equipment at the scan clock modifier and (3) providing a scan clock signal at an output of the scan clock modifier to drive a scan chain for the test block, wherein the scan clock signal varies based on values of the clock control signals.

In yet another aspect, an IC is disclosed. In one embodiment, the IC includes: (1) a test interface configured to receive a test scan clock signal, test data and test control signals, including clock control signals, from test equipment, (2) at least one scan chain coupled to the test interface and (3) a scan clock modifier, coupled between the test interface and the at least one scan chain, configured to modify the test scan clock signal to provide a scan clock signal that varies based on values of the clock control signals, the scan clock signal provided to drive the at least one scan chain.

In still another aspect, a scan clock modifier located on an integrated circuit and coupled between a test interface and at least one scan chain of the integrated circuit is disclosed. In one embodiment, the scan clock modifier includes: (1) a first AND gate having an output, an input coupled to the test interface for receiving a test scan clock signal and an input coupled to a first clock control line, (2) a second AND gate having an output, an input for receiving a modified test scan clock signal and an input coupled to a second clock control line and (3) an OR gate having an output, one input coupled to the first AND gate output, a second input coupled to the second AND gate output, and a third input coupled to a third clock control line, the OR gate configured to provide a scan clock signal at the output thereof for the at least one scan chain and in response to values on the first, second and third clock control lines.

In yet still another aspect, a library of standard cells is provided including a modulated clock signal.

BRIEF DESCRIPTION

Reference is now made to the following descriptions taken in conjunction with the accompanying drawings, in which.

DETAILED DESCRIPTION

Disclosed herein is logic circuitry added to an IC and a method to control the logic circuitry to provide a scan clock signal where the frequency of the scan clock signal can be varied for a test block. By varying the frequency of the scan clock signal within the test block, the quality of the test applied can be improved (see, e.g., Yang, et al., "Detection of Internal Stuck-open Faults in Scan Chains," *IEEE International Test Conference,* 2008). However, standard ATE, as stated above does not vary the frequency of the scan clock during a test block and hence such good quality patterns cannot be applied.

As such, the disclosed logic circuitry, a scan clock modifier, receives a test scan clock signal from ATE that has a fixed frequency. Additionally, the scan clock modifier receives clock control signals generated by the ATE and employed by the scan clock modifier to provide a scan clock signal for scan chains based on values of the clock control signals. Standard ATE, therefore, that provides a non-variable clock signal can be used for scan testing using a frequency varying scan clock signal.

Thus, an ATE can be used that supplies a test scan clock signal at the same constant frequency. The scan clock modifier can modify the frequency of the scan clock signal provided to the scan chains, based on the values on the clock control lines coupled to the scan clock modifier. The clock control lines can be manipulated by the ATE directly or via the TAP controller. A number of different implementations of this basic idea are possible. Disclosed herein are embodiments that are illustrated and described as examples. Though each connector or line may not be illustrated or may not be discussed in the disclosed ICs, one skilled in the art will understand that each embodiment includes the necessary conductors to couple the various components and carry the various signals, data, controls, etc.

Figure 1:
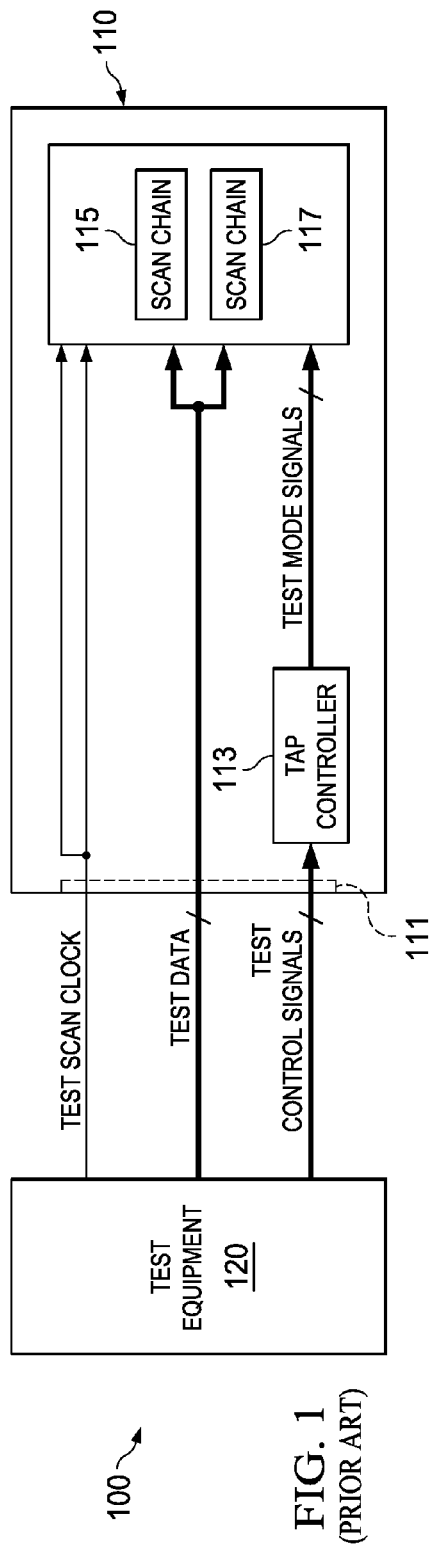
FIG. 1 is a block diagram illustrating a conventional configuration for performing testing of scan chains of an IC.

FIG. 1 is a block diagram of a testing environment 100 for performing scan testing of a conventional IC 110. In addition to the IC 110, the testing environment 100 also includes test equipment 120. The test equipment 120 is also conventional test equipment typically employed for IC scan testing. For example, the test equipment 120 may be conventional ATE.

The IC 110 includes a test interface 111, a TAP controller 113 and scan chains 115, 117. The test interface 111 is a TAP interface that is JTAG compliant and is controlled by the TAP controller 113. The scan chains 115, 117, are conventional scan chains that allow testing of the circuitry in the IC. The IC 110 may include additionally circuitry, interfaces, etc., that are typically included in an IC.

As illustrated, the test equipment 120 provides a test scan clock signal, test data and test control signals to the IC 110 via the test interface 111. The test data may be test patterns organized as a test block. The test data may be designed, for example, to detect stuck-open faults, stuck-at faults or other unintended high impedance faults (open defects) in the scan chains 115, 117. The test scan clock signal is a conventional clock signal having a constant frequency for a particular test block. The test control signals may include a test mode signal and provide instructions for the TAP controller 113 to use to control the application of the test data to the scan chains 115, 117.

Figure 2:
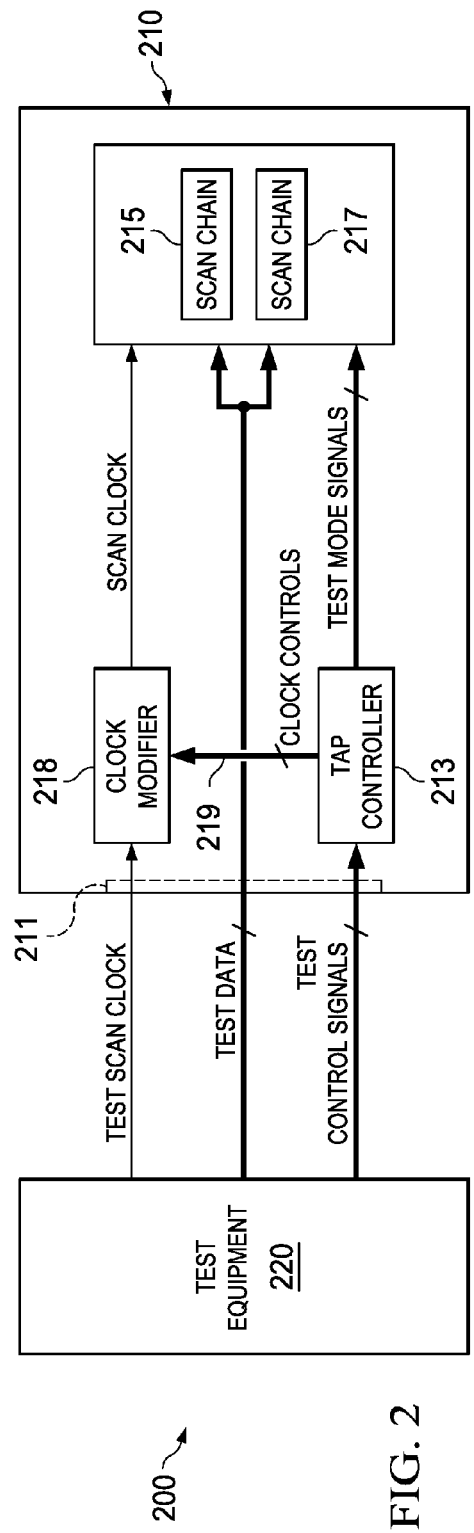
FIG. 2 is a block diagram of a configuration for testing an embodiment of an IC constructed according to the principles of the present invention.

FIG. 2 is a block diagram of a testing environment 200 for testing an embodiment of an IC 210 constructed according to the principles of the present invention. The testing environment 200 includes test equipment 220 coupled to the IC 210. The test equipment 220 may also be conventional ATE that provides a test scan clock signal, test data and test control signals. In addition to providing conventional test control signals, the test control signals provided by the test equipment 220 to the IC also includes clock control signals.

The IC 210 includes a test interface 211, a TAP controller 213 and scan chains 215, 217. Each of these components of the IC 210 may operate as and provide the same functionality as the test interface 111, the TAP controller 113 and the scan chains 115, 117, of the IC 110. Additionally, the TAP controller 213 may employ the clock control signals to direct modification of the test scan clock signal to provide a scan clock signal for the scan chains 215, 217.

The IC 210 also includes a scan clock modifier 218 and clock control lines 219 connecting the TAP controller 213 to the scan clock modifier 218. The scan clock modifier 218 is coupled between the test interface 211 and the scan chains 215, 217, and is configured to modify the test scan clock signal to provide a scan clock signal that varies based on values of the clock control signals. The scan clock modifier 218 then provides the scan clock signal to drive the scan chains 215, 217. The clock control signals are provided to the scan clock modifier 218 via the clock control lines 219. The scan clock modifier 218 may be implemented using logic circuitry including combinatorial logic. Comparison logic elements, also referred to as comparison logic such as OR gates, may be used along with AND gates.

The clock control lines 219 may be conventional data lines of an IC. In the IC 210, the clock control lines 219 couple the TAP controller 213 to the scan clock modifier 218. Each of the clock control lines 219 is designated to transmit a single, distinct clock control signal. The scan clock modifier 218 provides the scan clock signal in response to the values of the various clock control lines.

An example of employing the testing environment 200 for testing the IC 210 is now provided. For the example, a test block taken from F. Yang, et al., is used for detecting stuck-open faults in the scan chains 215, 217. As illustrated in Table 1, the test block is divided into 8 phases named A, B, . . . , H. Each of the phases of the test block lists a requirement for the scan clock signal. Separating the phases of the test block into individual (eight) test blocks with each test block using a clock signal with a non-varying frequency will affect the defect coverage and hence the quality of the test.

TABLE ONE

Phases of a test block with scan clock requirements
Scan Stuck-open Flush Tests

A. 11 . . . 1 (Normal)
B. 00 . . . 0 (Normal)
C. 0011 . . . 0011 (Normal)
D. Hold clock signal at 1 for M cycles (M = 10 normal clocks)
E. 0011 . . . 0011 (Normal)
F. Hold clock signal at 0 for N cycles (N = 15 normal clocks)
G. Half-speed flush test 0101 . . . 01 (2X slower clock)
H. Applying 01 slow for 2 clock cycles (100X slower clock)

A "Normal" scan clock implies using the test scan clock signal provided by the test equipment 220. The "2× slower clock" implies using half the frequency of the test scan clock signal. "Hold clock signal at 1 for M cycles" and "Hold clock signal at 0 for N cycles" implies freeze the scan clock signal at the appropriate value for M or N test scan clock signal cycles. "100× slower clock" implies a scan clock signal having a frequency that is 100 times slower than the frequency of the test scan clock signal.

Figure 3:
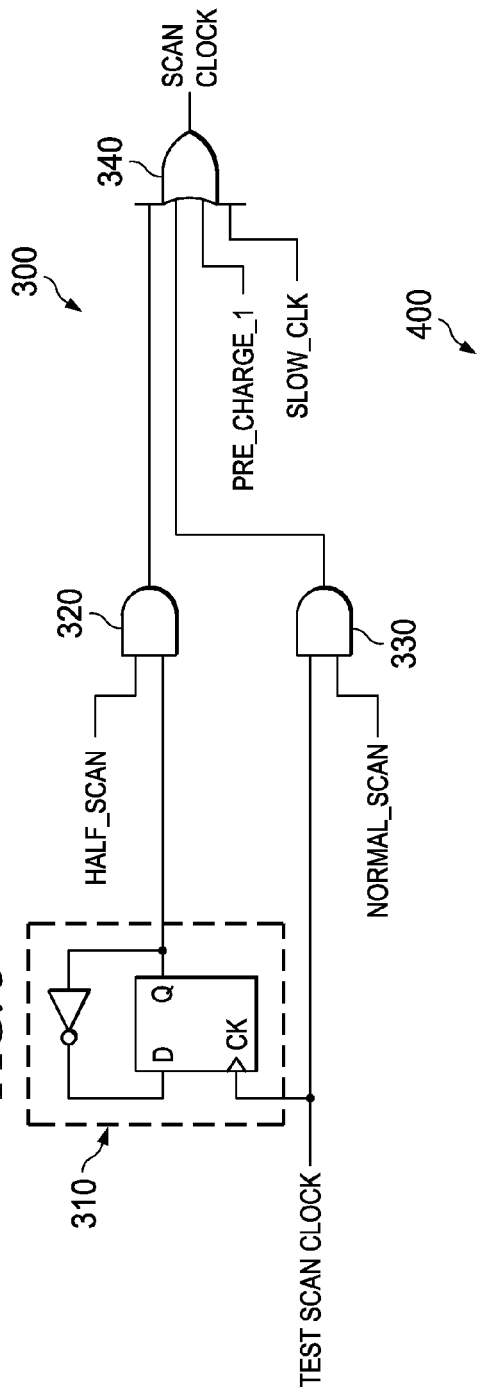
FIG. 3 is a schematic diagram of an embodiment of a scan clock modifier constructed according to the principles of the present invention.

FIG. 3 is a schematic diagram of an embodiment of a scan clock modifier 300 constructed according to the principles of the present invention. The scan clock modifier 300 includes logic circuitry, including combinatorial circuitry, configured to provide a scan clock signal in response to the values of clock control signals. The scan clock modifier 300 includes a latch 310, a first AND gate 320, a second AND gate 330 and an OR gate 340. Each of these devices are conventional logic components.

The latch 310 includes a D-Q flip-flop with a D input, a Q output and an inverter coupled between the D input and the Q output. The D-Q flip-flop also has a clock input coupled to a test scan clock signal. The test scan clock signal may be provided by ATE via a test interface.

The first AND gate 320 includes a first input coupled to a clock control line designated for a HALF_SCAN clock control signal. The first AND gate 320 also includes a second input that is coupled to the Q output of the latch 310. The first AND gate 320 also includes an output that is coupled to a first input of the OR gate 340.

The second AND gate 330 includes a first input coupled to the test scan clock signal and a second input coupled to another clock control line designated for a NORMAL_SCAN clock control signal. The second AND gate 330 also includes an output that is coupled to a second input of the OR gate 340.

220 via the TAP controller 213. This is achieved by loading the TAP controller 213 with appropriate instruction/data from the test equipment including the clock control signals. The TAP controller 213 can deliver the clock control signals to the scan clock modifier 300 via the clock control lines 219.

The clock control signals can be delivered to the TAP controller by interleaving the different phases of the test block with TAP phases. During the TAP phases, the TAP controller 213 is loaded with appropriate clock control signals to set/reset control settings delivered to the scan clock modifier 300. The insertion of TAP phases in the test block can increase the test time of the test block. The increase of test time may vary depending on the IC design, the test block used, etc.

Table Three below illustrates the TAP phases between the test block phases. For example, the TAP phase between phases C and D will set NORMAL_SCAN to 0 and Pre Charge_1 to 1. Also, phase H of the test block has been subdivided into 4 sub-phases to generate the two slow clock pulses for this phase. If shifting data into the TAP controller 213 takes more than 100 clock cycles, then the TAP phases can be performed back to back without the test equipment waiting in the H sub-phases.

TABLE THREE

| | | | | | | | | | | |
|---|---|---|---|---|---|---|---|---|---|---|
| Control settings between test block phases | | | | | | | | | | |
| | TAP | A | B | C | TAP | D | TAP | E | TAP | F | TAP | G |
| Control Settings | | Normal_scan | Normal_Scan | Normal_Scan | | Pre_charge_1 | | Normal_Scan | | None | | Half_Scan |
| | TAP | H1 | TAP | H2 | TAP | H3 | TAP | H4 | | | | |
| Control Settings | Set slow_clk = 1, Half_Scan = 0 | Slow_Clk = 1 | Set slow_clk = 0 | Slow_Clk = 0 | Set slow_clk = 1 | Slow_Clk = 1 | Set slow_clk = 0 | Slow_Clk = 0 | | | | |

The OR gate 340 includes an output and multiple inputs including the first and second inputs mentioned above. Additionally, the OR gate 340 includes a third and fourth input coupled to distinct clock control lines. The third input is coupled to a PRE_CHARGE_1 clock control signal and the fourth input is coupled to a SLOW_CLK clock control signal. The OR gate 340 provides the scan clock signal at the output in response to the values of the inputs.

The scan clock modifier 300 may be used as the scan clock modifier 210. As such, the example of testing began above with respect to FIG. 2 will continue using the more detailed description of the scan clock modifier 300. Table Two shows the clock control settings and the ideal time duration of each phase of the test block. For the example, a 20 Mhz test scan clock signal and a scan chain length of 200 are used.

Figure 4:
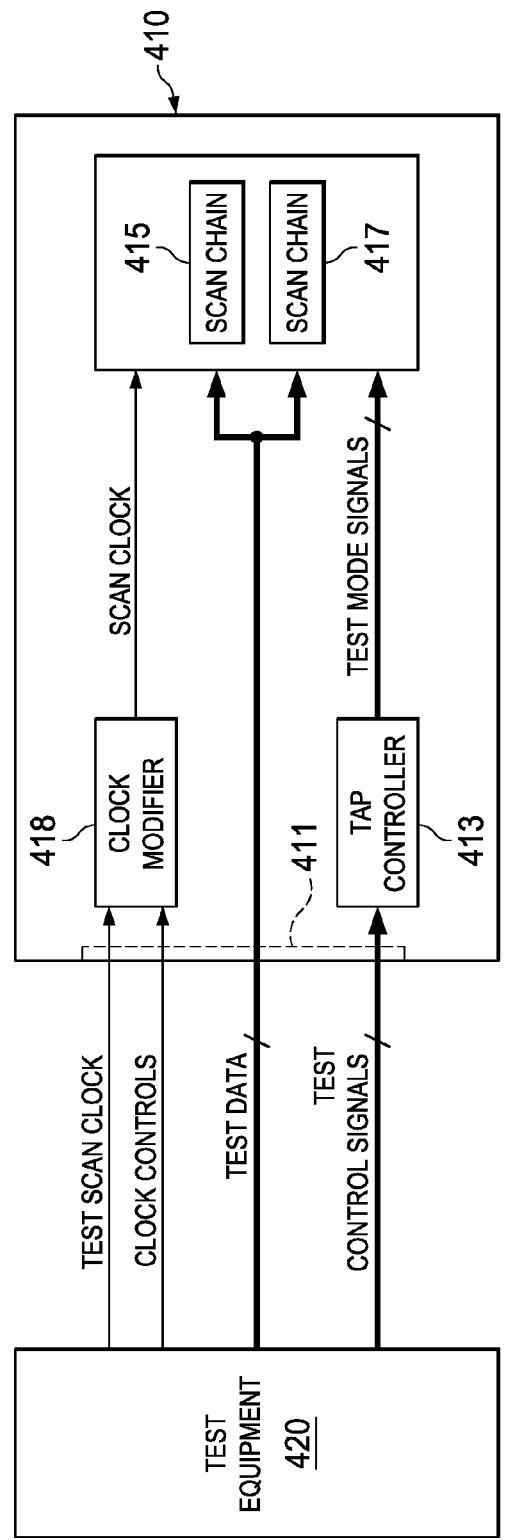
FIG. 4 is a block diagram of another configuration for testing yet another embodiment of an IC constructed according to the principles of the present invention.

FIG. 4 is a block diagram of another configuration for testing yet another embodiment of an IC 400 constructed according to the principles of the present invention. The testing environment 400 includes test equipment 420 coupled to the IC 410. The test equipment 420 may be ATE that provides a test scan clock signal, test data and test control signals and clock control signals to the IC 410. As such, the test equipment 420 can be the same as the test equipment 220.

The IC 410 includes a test interface 411, a TAP controller 413 and scan chains 415, 417. Each of these components of the IC 410 may operate as and provide the same functionality as the test interface 211, the TAP controller 213 and the scan chains 215, 217, of the IC 210. The IC 410 also includes a scan clock modifier 418 coupled to the test interface 411 via clock control lines 419. The test interface 411, therefore, unlike the test interface 211, provides an interface for the

TABLE TWO

| | | | | | | | | |
|---|---|---|---|---|---|---|---|---|
| Clock controls and phase duration of the test block | | | | | | | | |
| | Phase | | | | | | | |
| | A | B | C | D | E | F | G | H |
| Duration | 10 μs | 10 μs | 10 μs | 0.5 μs | 10 μs | 0.75 μs | 20 μs | 10 μs |
| Control Settings | Normal_scan | Normal_Scan | Normal_Scan | Pre_charge_1 | Normal_Scan | None | Half_Scan | Slow_Clk |

The four clock control signals in FIG. 3 and in Table Two (NORMAL_SCAN, HALF_SCAN, PRE_CHARGE_1 and SLOW_CLK) are indirectly controlled by the test equipment clock control signals to be provided from the test equipment 420 to the scan clock modifier 418 without employing the TAP controller 413. The test interface 411 may include additional pins to receive the clock control signals directly from the test equipment 420. One pin may be used for each of the clock control signals. As such, four additional pins may be used to receive the four clock control signals of FIG. 3.

The scan clock modifier 418 is coupled between the test interface 411 and the scan chains 415, 417, and is configured to modify the test scan clock signal to provide a scan clock signal that varies based on values of the clock control signals. The scan clock modifier 418 then provides the scan clock signal to drive the scan chains 415, 417. The clock control signals are provided to the scan clock modifier 418 via the clock control lines 419.

The clock control lines 419 may be conventional data lines of an IC. Each of the clock control lines 419 is designated to transmit a single, distinct clock control signal. The scan clock modifier 418 provides the scan clock signal in response to the values of the various clock control lines.

Thus, the scan clock modifier 418 may operate the same as the scan clock modifier 300. Unlike the testing environment 200, however, the test equipment 420 directly drives the clock control signals to the scan clock modifier 418 instead of employing a TAP controller. By the test equipment 420 directly providing the clock control signals to the scan clock modifier 418, the ideal test application time as shown in Table Two can be achieved since TAP phases do not have to be interleaved between the test block phases.

Figure 5:
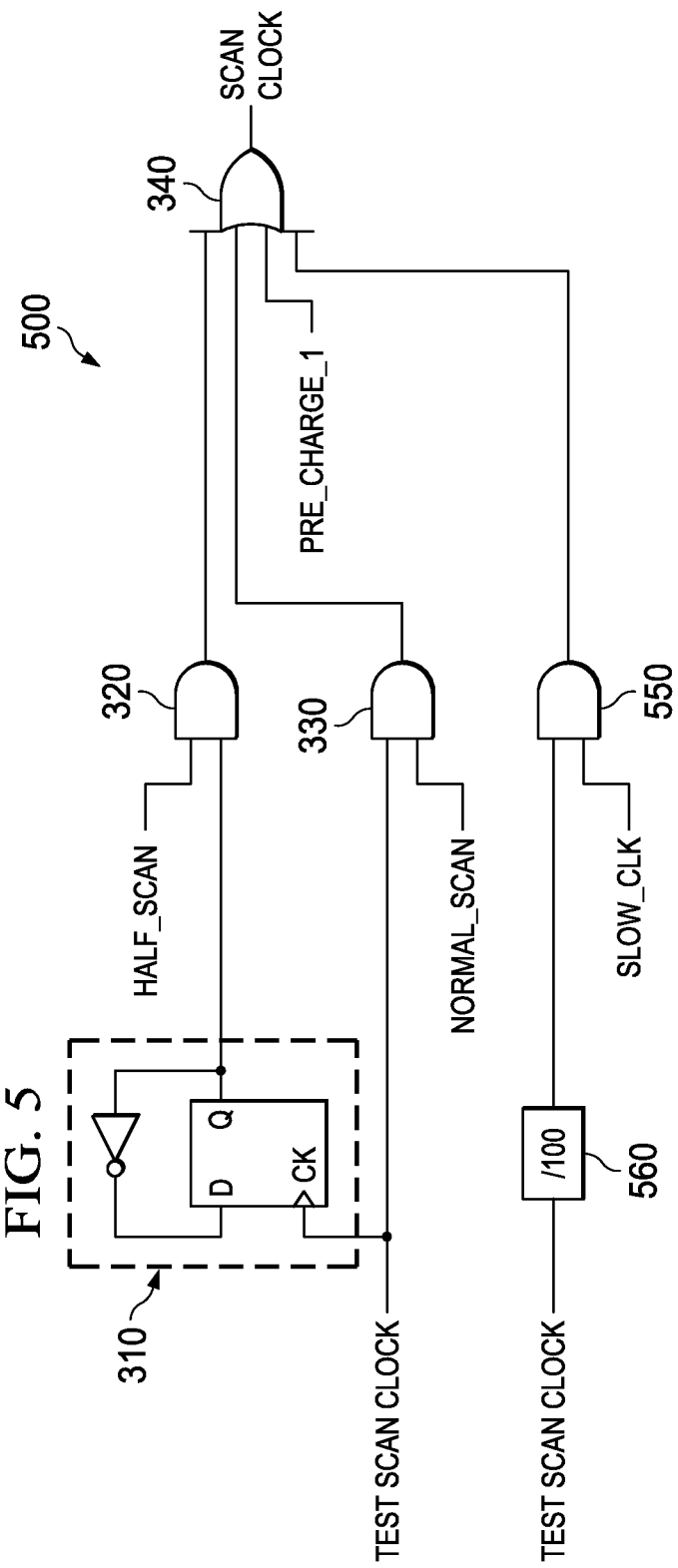
FIG. 5 is a schematic diagram of another embodiment of a scan clock modifier constructed according to the principles of the present invention.

FIG. 5 is a schematic diagram of another embodiment of a scan clock modifier 500 constructed according to the principles of the present invention. The scan clock modifier 500, like the scan clock modifier 300, also includes logic circuitry configured to provide a scan clock signal in response to the values of clock control signals. As with the scan clock modifier 300, the scan clock modifier 500 includes the latch 310, the first AND gate 320, the second AND gate 330 and the OR gate 340. Similarly, the OR gate 340 provides the scan clock signal at the output in response to the values of the inputs.

Unlike the scan clock modifier 300, the scan clock modifier 500 includes additional logic circuitry, a third AND gate 550, and a divide-by-circuit 560. The third AND gate 550 includes an output, a first input coupled to an output of the divide-by-circuit 560 and a second input coupled to the SLOW_CLK control clock signal. The output of the third AND gate 550 is coupled to the fourth input of the OR gate 340.

An input of the divide-by-circuit 560 is coupled to the test scan clock signal. The divide-by-circuit 560 is configured to generate the slow clock from the test scan clock signal when the SLOW_CLK clock control signal is set to one (1). With the divide-by-circuit 560, multiple TAP phases may not be needed for a particular phase. Considering the ongoing example, the divide-by-circuit 560 would be a divide-by-100 circuit to reduce the number of TAP phases required for phase H to a single TAP phase.

Figure 6:
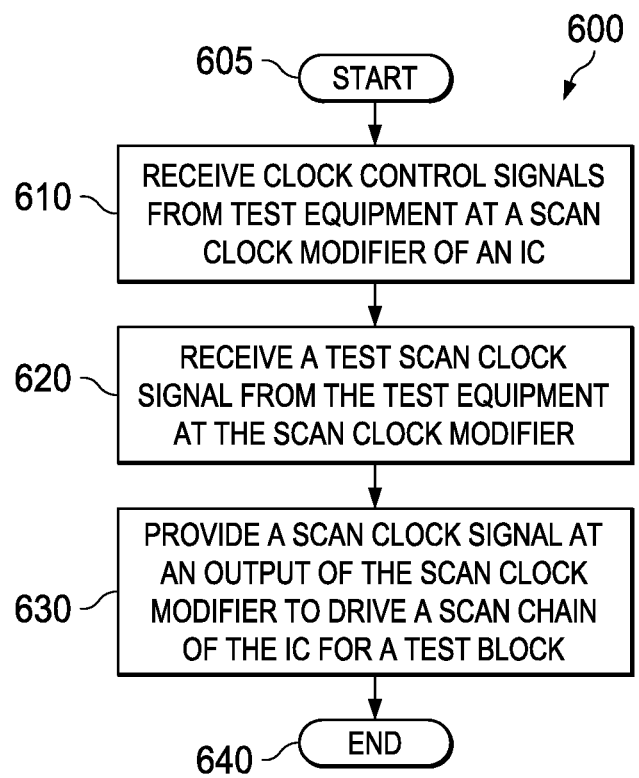
FIG. 6 is a method of providing a variable scan clock for a test block carried out according to the principles of the present invention.

FIG. 6 is a flow diagram of a method 600 of providing a variable scan clock for a test block carried out according to the principles of the present invention. The method begins in a step 605.

After starting, clock control signals are received from test equipment at a scan clock modifier of an IC in a step 620. The clock control signals may be received directly from the test equipment via a test interface of the IC. In another embodiment, the clock control signals may be received from the test equipment via a TAP controller of the IC. Either way of receiving, the test equipment can be used to manipulate the clock control signals that are provided to the scan clock modifier.

In a step 620, a test scan clock signal is received from the test equipment at the scan clock modifier. The test scan clock signal has a fixed frequency for a particular test block of test data. The test equipment may be ATE and the test scan clock signal may be received via the test interface of the IC.

In a step 630, a scan clock signal is provided at an output of the scan clock modifier to drive a scan chain of the IC for the test block. The clock control signals may correspond to phases of the test block. Between the various phases of the test block, the clock control signals may be reset. The scan clock signal can be varied (e.g., frequency is varied) based on values of the clock control signals. In one embodiment, the scan clock modifier may provide the test scan clock signal as the scan clock signal. After providing the scan clock signal, the method 600 ends in a step 640.

Those skilled in the art to which this application relates will appreciate that other and further additions, deletions, substitutions and modifications may be made to the described embodiments.

What is claimed is:

1. A scan clock modifier of an integrated circuit configured to receive a single test scan clock signal and scan clock control signals from test equipment for applying a test block to said integrated circuit, comprising:
   logic circuitry configured to receive said test scan clock signal and a first scan clock control signal from said test equipment and provide at least one selected clock signal based on said test scan clock signal, a modified test scan clock signal and said first scan clock control signal, said logic circuitry further configured to hold a state of said test scan clock signal to provide said modified test scan clock signal; and
   comparison logic configured to receive at least one other scan clock control signal from said test equipment and provide a single scan clock signal based on said at least one selected clock signal and said at least one other scan clock control signal, wherein said first scan clock control signal and said at least one other scan clock control signal are different scan clock control signals, wherein said single scan clock signal is derived from a single clock signal received from said test equipment, wherein said single scan clock signal has a frequency that is variable based on values of said first scan clock control signal and said at least one other scan clock control signal.

2. The scan clock modifier as recited in claim 1 wherein said logic circuitry includes a first AND gate and a second AND gate, wherein said first AND gate is configured to receive said test scan clock signal and said first scan clock control signal and provide said at least one selected clock signal based thereon.

3. The scan clock modifier as recited in claim 1 wherein said single clock signal is said test scan clock signal.

4. The scan clock modifier as recited in claim 2 wherein said second AND gate is configured to receive a modified test scan clock signal based on said test scan clock signal.

5. The scan clock modifier as recited in claim 1 wherein said comparison logic is a single OR gate.

6. The scan clock modifier as recited in claim 1 wherein said comparison logic is configured to receive multiple scan clock control signals that are distinct, each of said multiple scan clock control signals provided by said test equipment.

7. The scan clock modifier as recited in claim 1 wherein said comparison logic is configured to receive multiple selected clock signals that are distinct, each of said multiple selected clock signals provided by said logic circuitry.

8. A method of providing a variable scan clock for a test block from a single test scan clock signal received from test equipment, said variable scan clock for testing scan chains of an integrated circuit, comprising:

receiving a test scan clock signal from said test equipment at a scan clock modifier of said integrated circuit, said test scan clock signal having a fixed frequency for a test block;

providing a modified test scan clock signal by holding a state of said test scan clock signal;

receiving scan clock control signals from said test equipment at said scan clock modifier; and providing a single scan clock signal from said test scan clock signal at an output of said scan clock modifier to drive a scan chain for said test block, wherein said single scan clock signal is derived from said modified test scan clock signal, said test scan clock signal and said scan clock control signals.

9. The method as recited in claim 8 wherein said scan clock control signals are received from said test equipment via a test access port controller of said integrated circuit.

10. The method as recited in claim 8 wherein said scan clock control signals correspond to phases of said test block.

11. The method as recited in claim 8 further comprising manipulating said scan clock control signals with said test equipment.

12. The method as recited in claim 8 further comprising resetting said scan clock control signals between phases of said test block.

13. The method as recited in claim 8 where said single scan clock signal varies during said test block and wherein a maximum frequency of said single scan clock signal during said test block is equal to a frequency of said test scan clock signal.

14. An integrated circuit, comprising:

a test interface configured to receive a test scan clock signal, test data and test control signals, including scan clock control signals, from test equipment;

at least one scan chain coupled to said test interface; and a scan clock modifier, coupled between said test interface and said at least one scan chain, configured to provide a modified test scan clock signal from said test scan clock signal by holding a state thereof and to provide a single scan clock signal derived from said modified test scan clock signal and said test scan clock signal, wherein said single scan clock signal has a variable frequency that varies based on values of said scan clock control signals, said scan clock signal provided to drive said at least one scan chain, wherein said single scan clock signal is derived from a single clock signal received from said test equipment.

15. The integrated circuit as recited in claim 14 further comprising a test access port controller configured to receive said scan clock control signals from said test equipment via said test interface and provide said scan clock control signals to said scan clock modifier.

16. The integrated circuit as recited in claim 14 wherein said test scan clock signal, said test data and said test control signals are associated with a test block generated by said test equipment, said test scan clock signal having a fixed frequency for said test block.

17. The integrated circuit as recited in claim 16 wherein said scan clock control signals correspond to phases of said test block.

18. The integrated circuit as recited in claim 16 wherein said scan clock control signals are manipulated by said test equipment with respect to phases of said test block.

19. The integrated circuit as recited in claim 14 wherein said scan clock modifier includes:

logic circuitry configured to provide at least one selected clock signal based on said test scan clock signal, said modified test scan clock signal and one of said scan clock control signals; and comparison logic configured to provide said single scan clock signal based on said at least one selected clock signal and at least one other of said scan clock control signals, wherein said one of said scan clock control signals and said at least one other of said scan clock control signals are different scan clock control signals.

20. A scan clock modifier located on an integrated circuit and coupled between a test interface and at least one scan chain of said integrated circuit, said scan clock modifier comprising:

a first AND gate having an output, an input coupled to said test interface for receiving a single test scan clock signal from test equipment and an input coupled to a first scan clock control line;

a latch having an input for receiving said single test scan clock signal and providing a modified test scan clock signal;

a second AND gate having an output, an input for receiving said modified test scan clock signal and an input coupled to a second scan clock control line; and an OR gate having an output, one input coupled to said first AND gate output, a second input coupled to said second AND gate output, and a third input coupled to a third scan clock control line, said OR gate configured to provide a single scan clock signal at said output thereof for said at least one scan chain and in response to values on said first, second and third scan clock control lines, wherein said single scan clock signal is derived from said single test scan clock signal and has a variable frequency based on said values of said first, second and third scan clock control lines.

21. The scan clock modifier as recited in claim 20 further comprising a third AND gate having an output coupled to said OR gate, an input coupled to said test interface for receiving said test scan clock signal via delay circuitry and an input coupled to a fourth scan clock control line, said OR gate configured to provide said single scan clock signal in response to values on said first, second, third and fourth scan clock control lines.

22. A library of standard logic elements, comprising:

a standard logic element corresponding to a scan clock modifier, including:

logic circuitry configured to provide at least one selected clock signal based on a test scan clock signal, a modified test scan clock signal and a first scan clock control signal, both of said test scan clock signal and said first scan clock control signal received from test equipment, said logic circuitry further configured to hold a state of said test scan clock signal to provide said modified test scan clock signal; and comparison logic configured to provide a single scan clock signal based on said at least one selected clock signal and at least one other scan clock control signal received from said test equipment, wherein said first scan clock control signal and said at least one other scan clock control signal are different scan clock control signals, wherein said single scan clock signal is derived from a single clock signal received from said test equipment and has a frequency that is variable based on values of said first scan clock control signal and said at least one other scan clock control signal.

* * * * *